(12) United States Patent
Lo Calzo et al.

(10) Patent No.: US 12,011,983 B2
(45) Date of Patent: Jun. 18, 2024

(54) VEHICLE PROVIDED WITH TWO ELECTRIC MOTORS

(71) Applicant: FERRARI S.p.A., Modena (IT)

(72) Inventors: Giovanni Lo Calzo, Modena (IT); Ugo Sitta, Modena (IT); Christian Montebello, Modena (IT); Alessandro Di Blasio, Modena (IT)

(73) Assignee: FERRARI S.P.A., Modena (IT)

( * ) Notice: Subject to any disclaimer, the term of this patent is extended or adjusted under 35 U.S.C. 154(b) by 230 days.

(21) Appl. No.: 17/743,522

(22) Filed: May 13, 2022

(65) Prior Publication Data
US 2022/0379701 A1 Dec. 1, 2022

(30) Foreign Application Priority Data

May 26, 2021 (IT) .................. 102021000013679

(51) Int. Cl.
| | | |
|---|---|---|
| *B60K 1/00* | (2006.01) | |
| *B60K 7/00* | (2006.01) | |
| *B60L 58/26* | (2019.01) | |

(52) U.S. Cl.
CPC .............. *B60K 1/00* (2013.01); *B60K 7/0007* (2013.01); *B60L 58/26* (2019.02); *B60K 2001/001* (2013.01); *B60K 2007/0092* (2013.01)

(58) Field of Classification Search
CPC .................. B60K 1/00; B60K 7/0007; B60K 2007/0092; B60L 58/26; H05K 7/20927;
(Continued)

(56) References Cited

U.S. PATENT DOCUMENTS

| 8,169,780 B2 * | 5/2012 | Yoshino ............. H05K 7/20927 |
| | | 361/689 |
| 9,345,150 B2 * | 5/2016 | Fukumasu ......... H02K 11/0094 |
| | | (Continued) | |

FOREIGN PATENT DOCUMENTS

| EP | 3819158 A1 | 5/2021 |
| WO | 2017092192 A1 | 6/2017 |
| WO | 2018235049 A1 | 12/2018 |

OTHER PUBLICATIONS

Extended European Search Report for Application No. 22174663.9 dated Oct. 27, 2022.
(Continued)

*Primary Examiner* — Erez Gurari
(74) *Attorney, Agent, or Firm* — CANTOR COLBURN LLP (57) ABSTRACT

A vehicle having: two front wheels; two rear wheels; two electric motors, which are connected to the two wheels of a same axle; and an electronic power converter to control both electric motors. The electronic power converter has: two groups of power modules; at least one capacitor, which is connected in parallel to a DC input; a container, which houses the two groups of power modules and the capacitor and is provided with a cup-shaped body provided with a lower wall; and a cooling system provided with a chamber, which is configured to be flown through by a cooling liquid. The chamber of the cooling system is delimited, on one side, by the lower wall of the cup-shaped body of the container and, on the other side, by a containing wall, which is arranged at a given distance from the lower wall.

12 Claims, 7 Drawing Sheets

(58) Field of Classification Search
CPC ............. H05K 7/1432; H05K 7/14322; H05K 7/20945
See application file for complete search history.

(56) References Cited

U.S. PATENT DOCUMENTS

| | | | | |
|---|---|---|---|---|
| 9,608,528 | B2* | 3/2017 | Nakazawa | H05K 7/1432 |
| 9,722,531 | B2* | 8/2017 | Singh | H01R 24/48 |
| 9,769,962 | B2* | 9/2017 | Huang | H05K 7/20872 |
| 9,844,168 | B2* | 12/2017 | Jeon | H05K 7/20927 |
| 10,461,656 | B2* | 10/2019 | Okubo | H05K 7/2089 |
| 10,512,198 | B2* | 12/2019 | Okazaki | H05K 7/20927 |
| 11,026,353 | B2* | 6/2021 | Birdeanu | H05K 7/20263 |
| 11,071,233 | B1* | 7/2021 | Robert | H05K 9/0049 |
| 11,596,088 | B2* | 2/2023 | Zhou | H05K 7/20927 |
| 11,864,357 | B2* | 1/2024 | Zhou | H05K 7/20254 |
| 2003/0067748 | A1 | 4/2003 | Tamba et al. | |
| 2019/0126773 | A1* | 5/2019 | Chung | H05K 7/20872 |
| 2022/0379701 | A1* | 12/2022 | Lo Calzo | B60K 7/0007 |
| 2022/0385202 | A1* | 12/2022 | Shirai | H02M 7/003 |
| 2024/0042952 | A1* | 2/2024 | Fukuchi | B60L 53/302 |

OTHER PUBLICATIONS

Italian Search Report for Application No. 102021000013679, completed Feb. 11, 2022, 9 pages.

* cited by examiner

VEHICLE PROVIDED WITH TWO ELECTRIC MOTORS

CROSS-REFERENCE TO RELATED APPLICATIONS

This Patent Applications claims priority from Italian Patent Application No. 102021000013679 filed on May 26, 2021, the entire disclosure of which is incorporated herein by reference.

TECHNICAL FIELD

The invention relates to a vehicle provided with two electric motors.

BACKGROUND ART

A vehicle can be provided with one single electric motor or with several electric motors (in which case, the drive is a full electric drive) or it can be provided with one or more electric motors combined with a combustion engine (in which case, the drive can be a full electric drive, a combustion drive or a hybrid drive).

The electric motor (or each electric motor) is mechanically connected to the drive wheels and is electrically connected to a power storage system through the interposition of an electronic power converter (namely, an "inverter"), which turns DC power (on the side connected to the storage system) into AC power (on the side connected to the electric motor) and vice versa.

When the nominal power of the electric motor is relatively high, the electronic power converter needs to be provided with a liquid cooling system in order to prevent the electronic power components (namely, the electronic components through which electric current affecting the stator windings of the electric motor flows) from excessively heating.

Patent applications US2003067748A1 and WO2018235049A1 describe respective examples of an electronic power converter (namely, an inverter) cooled by a liquid and designed for an electric motor of a vehicle.

DESCRIPTION OF THE INVENTION

The object of the invention is to provide a vehicle provided with two electric motors, which is also provided with a liquid cooling system, which is, at the same time, effective (namely, ensures that the work temperature of the electronic power components never is too high), efficient (namely, uses a small cooling liquid flow rate) and compact.

According to the invention, there is provided a vehicle provided with two electric motors according to the appended claims.

The appended claims describe preferred embodiments of the invention and form an integral part of the description.

BRIEF DESCRIPTION OF THE DRAWINGS

The invention will now be described with reference to the accompanying drawings showing a non-limiting embodiment thereof, wherein.

PREFERRED EMBODIMENTS OF THE INVENTION

Figure 1:
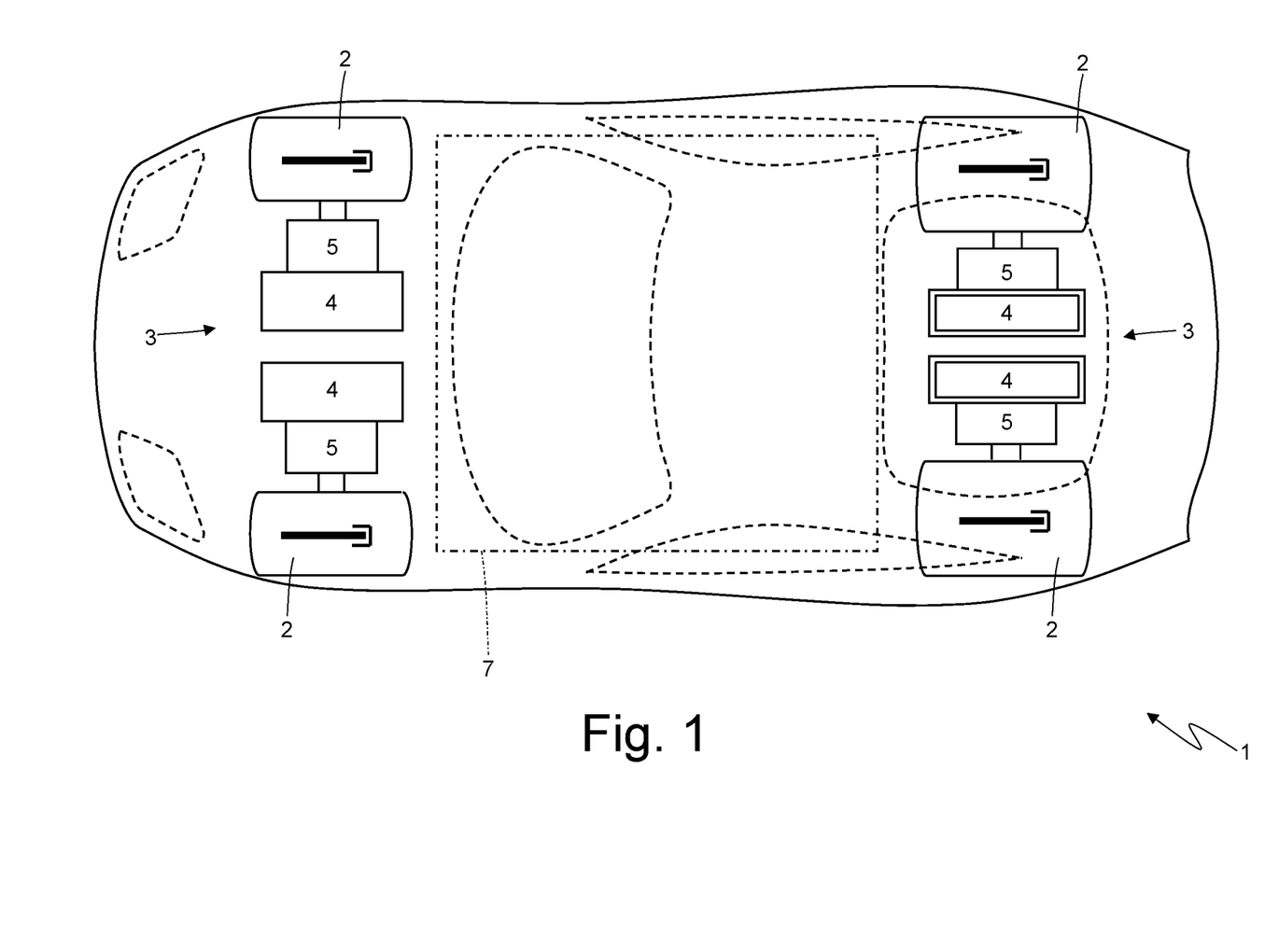
FIG. 1 is a schematic plan view of a road vehicle with electric drive.

In FIG. 1, number 1 indicates, as a whole, an electric drive vehicle provided with four drive wheels 2 (two front drive wheels 2 and two rear drive wheels 2).

The vehicle 1 comprises an electric powertrain system 3, which is arranged in a front position (namely, is connected to the two front drive wheels 2), and an electric powertrain system 3, which is arranged in a rear position (namely, is connected to the two rear drive wheels 2), is structurally identical to the electric powertrain system 3 arranged in a front position and is mechanically independent of and separate from the electric powertrain system 3 arranged in a front position.

According to a different embodiment which is not shown herein, the vehicle 1 comprises one single electric powertrain system 3 (arranged in a front position or arranged in a rear position) and, therefore, it only has two drive wheels 2; in this embodiment, the vehicle 1 could also comprise a combustion powertrain system connected to the drive wheels 2 that do not receive the motion from the electric powertrain system 3 and the combustion powertrain system could be provided with a further electric motor 4 connected to the drive shaft of an internal combustion engine.

Each electric powertrain system 3 comprises a pair of reversible electric motors 4 (i.e. which can work both as eclectic motor, absorbing electrical energy and generating a mechanical torque, and as electric generator, absorbing mechanical energy and generating electrical energy) provided with respective shafts and a pair of drivetrains 5, which connect the electric motors 4 (namely, the shafts of the electric motors 4) to the corresponding drive wheels 2 without the interposition of a clutch.

Figure 2:
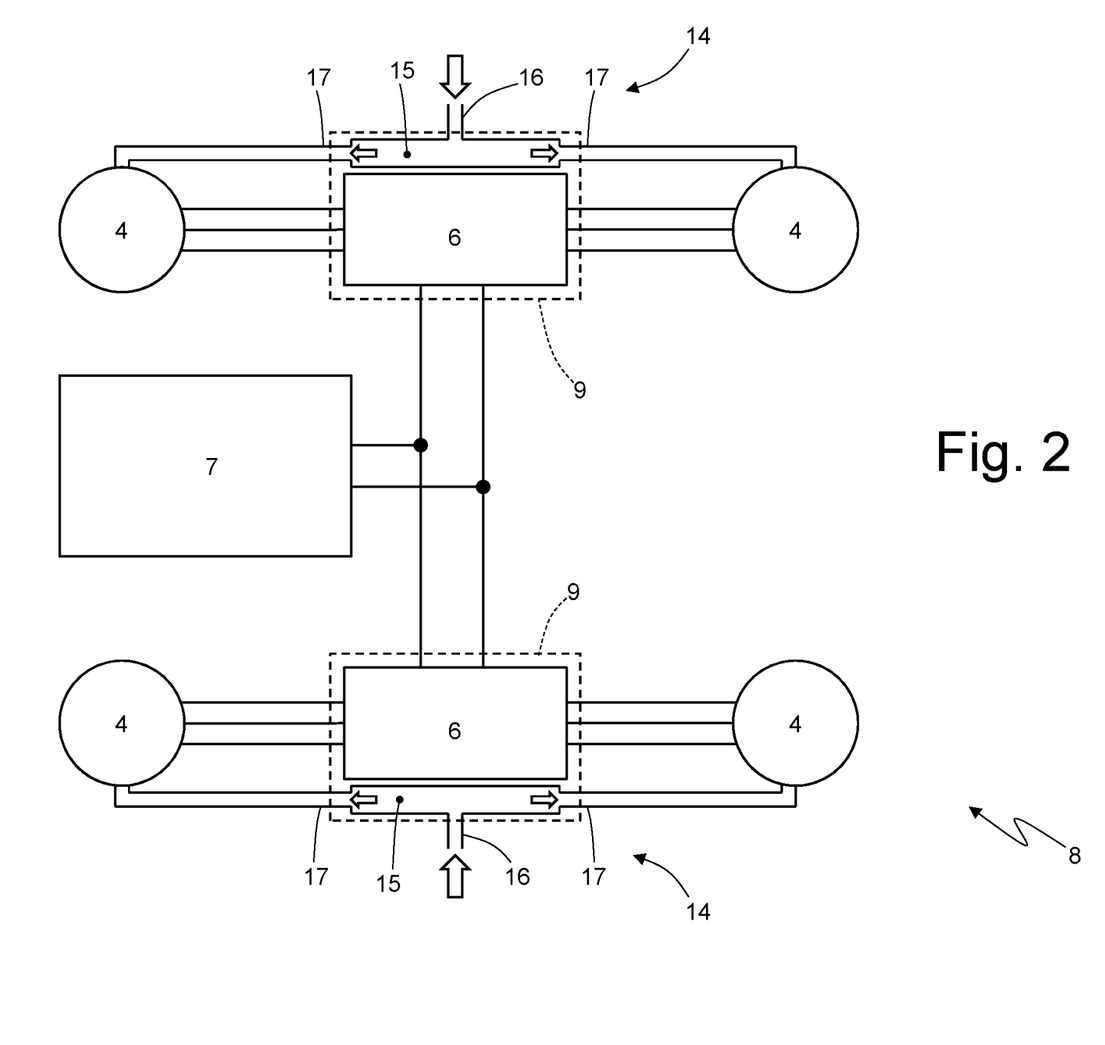
FIG. 2 is a schematic view of an high-voltage electric system of the vehicle of FIG. 1 provided with two electronic power converters according to the invention.

According to FIG. 2, each electric motor 4 is controlled by an AC/DC electronic power converter 6 (namely, an "inverter"), which is connected to a power storage system 7 provided with chemical batteries; namely, each electronic power converter 6 is a two-way converter and comprises a DC side, which is connected to the power storage system 7, and a three-phase AC side, which is connected to at least one electric motor 4.

As schematically shown in FIG. 1, the power storage system 7 has a flat and (relatively) thin conformation so that it can be integrated inside the floor of the vehicle 1.

According to FIG. 2, a high-voltage electric system 8 of the vehicle 1 comprises two electronic power converters 6, which are structurally identical to one another: one single front electronic power converter 6 powers both front electric motors 4 and one single rear electronic power converter 6 powers both rear electric motors 4. Each electronic power converter 6 is housed in a corresponding container 9.

Figure 3:
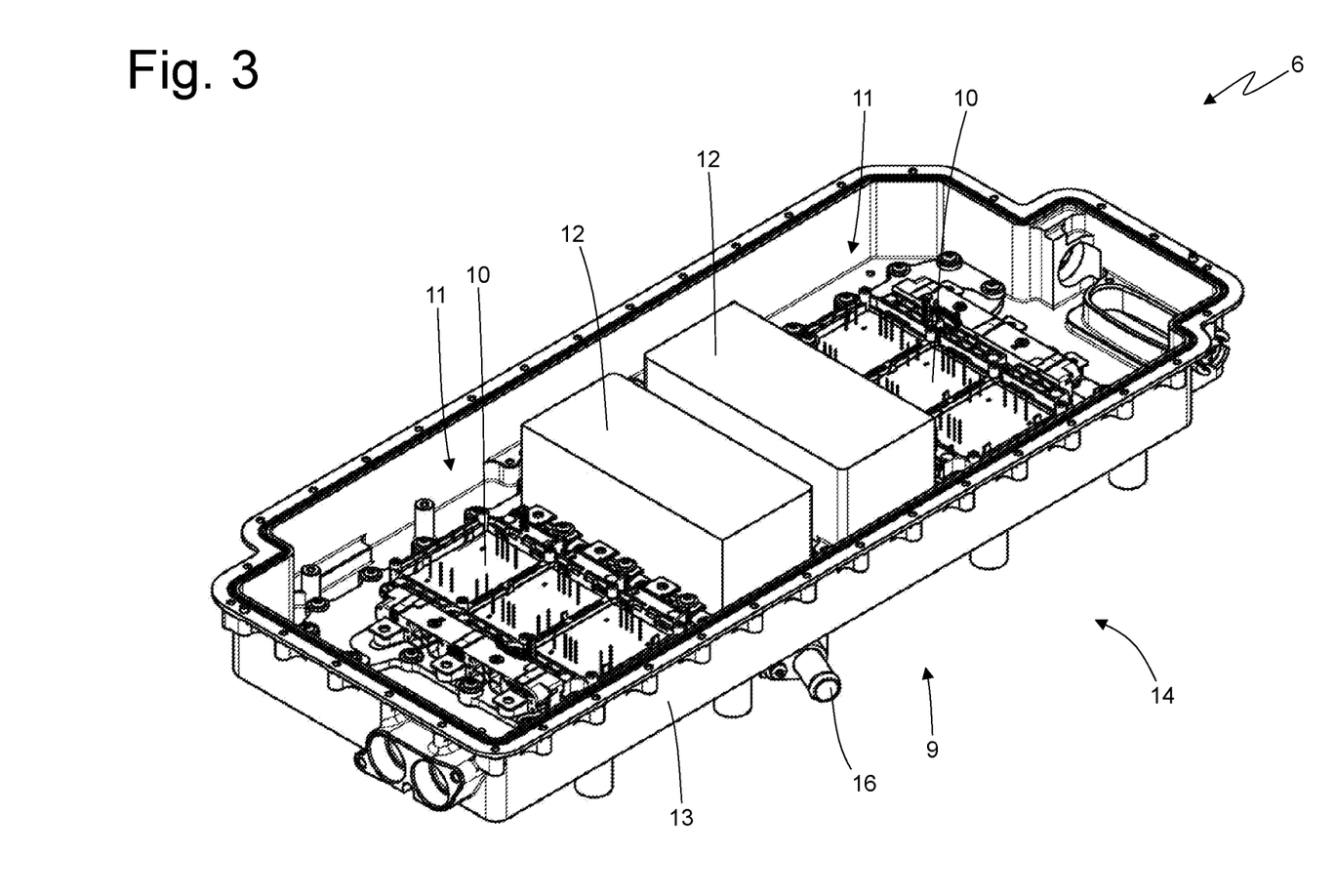
FIG. 3 is a perspective view, with parts removed for greater clarity, of one single electronic power converter of the high-voltage electric system of FIG. 2.

According to FIG. 3, each electronic power converter (both the front and the rear one) comprises six power modules 10, each designed to power with an alternating current one single phase of a corresponding electric motor 4; namely, each power module 10 represents one single "leg" of a three-phase inverter and is provided with respective transistors, each having a gate. In particular, the six power modules 10 are divided into two groups 11, each consisting of three power modules 10, which are arranged next to one another on a same plane: a group 11 of three power modules 10 is arranged on the right side of the container 9 and powers the phases of the right electric motor 4 and the other group 11 of three power modules 10 is arranged on the left side of the container 9 and powers the phases of the left electric motor 4. A group 11 of power modules 10 is better shown in FIG. 4.

According to FIG. 2 each electronic power converter (both the front and the rear one) comprises one single common DC input, to which all six power modules 10 are connected in parallel. According to FIG. 3, each electronic power converter 6 (both the front and the rear one) comprises two capacitors 12, which are both connected in parallel to the common input and are arranged next to one another in a central area of the container 9; namely, the two capacitors 12 are arranged between the two groups 11 of power modules 10.

Each electronic power converter 6 comprises two gate control devices (not shown), which are arranged above the corresponding groups 10 of power modules 11 and, hence, are arranged at the two ends of the container 9. Each gate control device is connected to the gates of the transistors of the power modules 10 of the corresponding group 11. The gate control devices also include current sensors, which measure the intensity of the alternating current flowing through the power modules 10.

Each electronic power converter 6 comprises a control unit (not shown), which controls the operation of the entire electronic power converter 6 and is directly connected to the two gate control devices. Namely, there is an electric (physical) connection between the control unit and the two gate control devices and there is a further electric (physical) connection between the two gate control devices and the power modules 10. In each electronic power converter 6, the entire control logic is implemented in the control unit, which is the "brain" of the electronic power converter 6.

Figure 4:
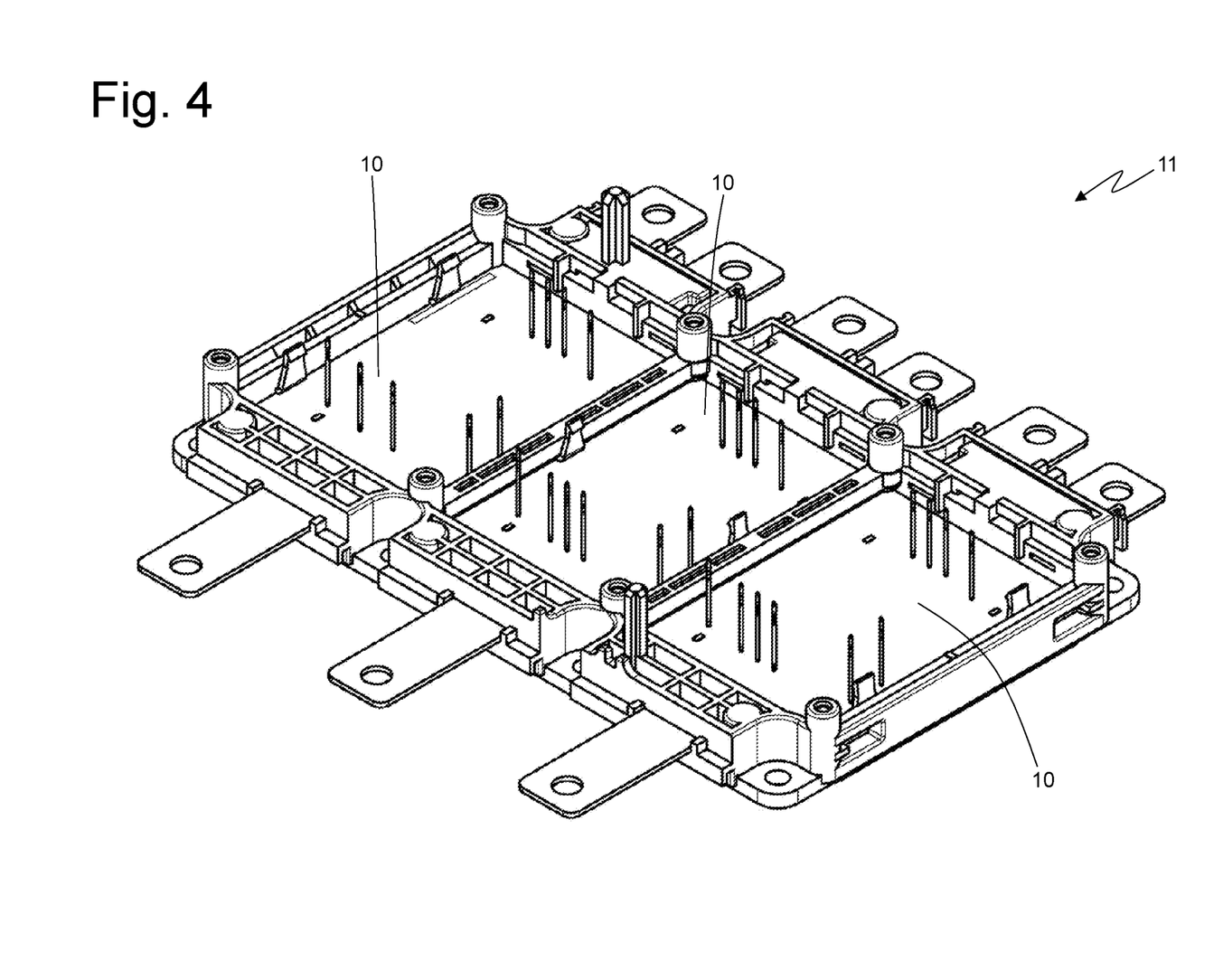
FIG. 4 is a perspective view of a group of power modules of the electronic power converter of FIG. 3.

According to FIG. 4, each container 9 approximately has the shape of a parallelepiped and consists of a lower cup-shaped body 13 and of a lid (not shown), which is fixed to the cup-shaped body 13. The groups 11 of power modules 10, the two capacitors 12 and the two gate control devices are housed (fixed) in the cup-shaped body 13, whereas the control unit is housed (fixed) in the lid (not shown).

Each electronic power converter 6 comprises a cooling system 14 provided with a chamber 15, which is obtained inside the container 9 and where a cooling liquid is caused to flow. According to FIG. 2, the cooling systems 14 of the two electronic power converters 6 are connected to a hydraulic circuit configured to cause a cooling liquid to flow through the chambers 15. In particular, each chamber 15 comprises one single inlet 16 arranged at the centre (namely, in the middle of the chamber 15) and two outlets 17 arranged on the sides (namely, at the opposite ends of the chamber 15). In each chamber 15, the "cold" cooling liquid flows in from the inlet 16 arranged at the centre and is divided into two symmetrical and contrary flows, so that the "hot" cooling liquid flows out half on the right (namely on one side) and half on the left (namely, on the other side) through the two outlets 17 arranged on the sides. Each outlet 17 is connected to a corresponding electric motor 4 so that the cooling liquid flowing out of the chamber 15 of an electronic power converter 6 flows into the two electric motors 4 after having been divided into two symmetrical and contrary flows inside the chamber 15.

Figure 5:
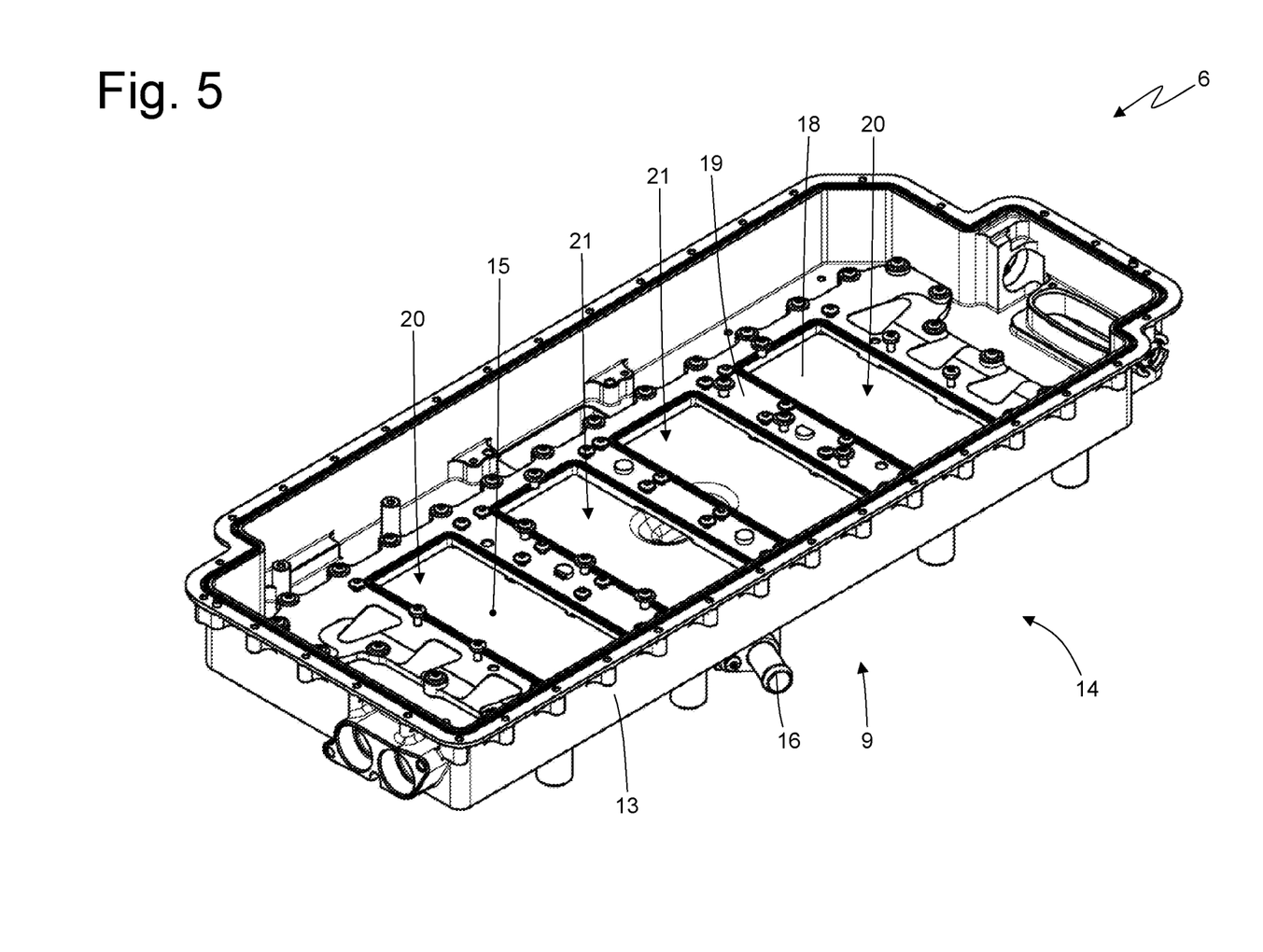
FIG. 5 is a perspective view from the top of a cup-shaped body of a container of the electronic power converter of FIG. 3.
Figure 6:
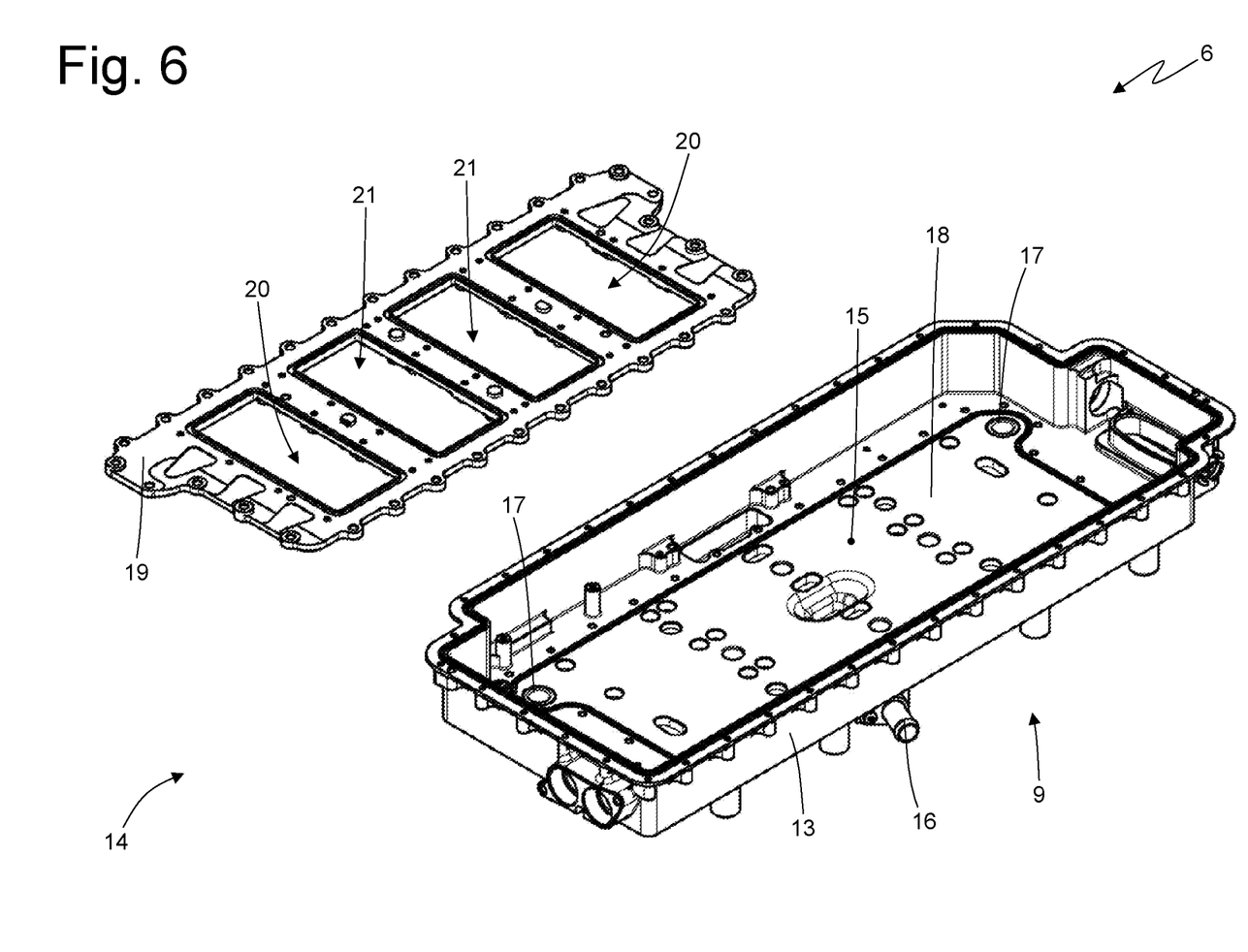
FIG. 6 is a perspective and exploded view from the top of the cup-shaped body of FIG. 5.

According to FIGS. 5 and 6, in each electronic power converter 6, the chamber 15 is delimited, on one side, by a lower wall 18 of the cup-shaped body 13 of the container 9 (the lower wall 18 is opposite the lid) and, on the other side, by a containing wall 19, which is arranged at a given distance from the lower wall 18. In particular, the containing wall 19 is smaller than the lower wall 18 and is fixed to the lower wall 18 in a sealed manner (typically, with the interposition of a gasket visible in FIG. 6); according to a preferred embodiment, the containing wall 19 is fixed to the lower wall 18 by means of screws, which go through eyelets present on the containing wall 19 and are screwed into threaded holes obtained in the lower wall 18.

Figure 7:
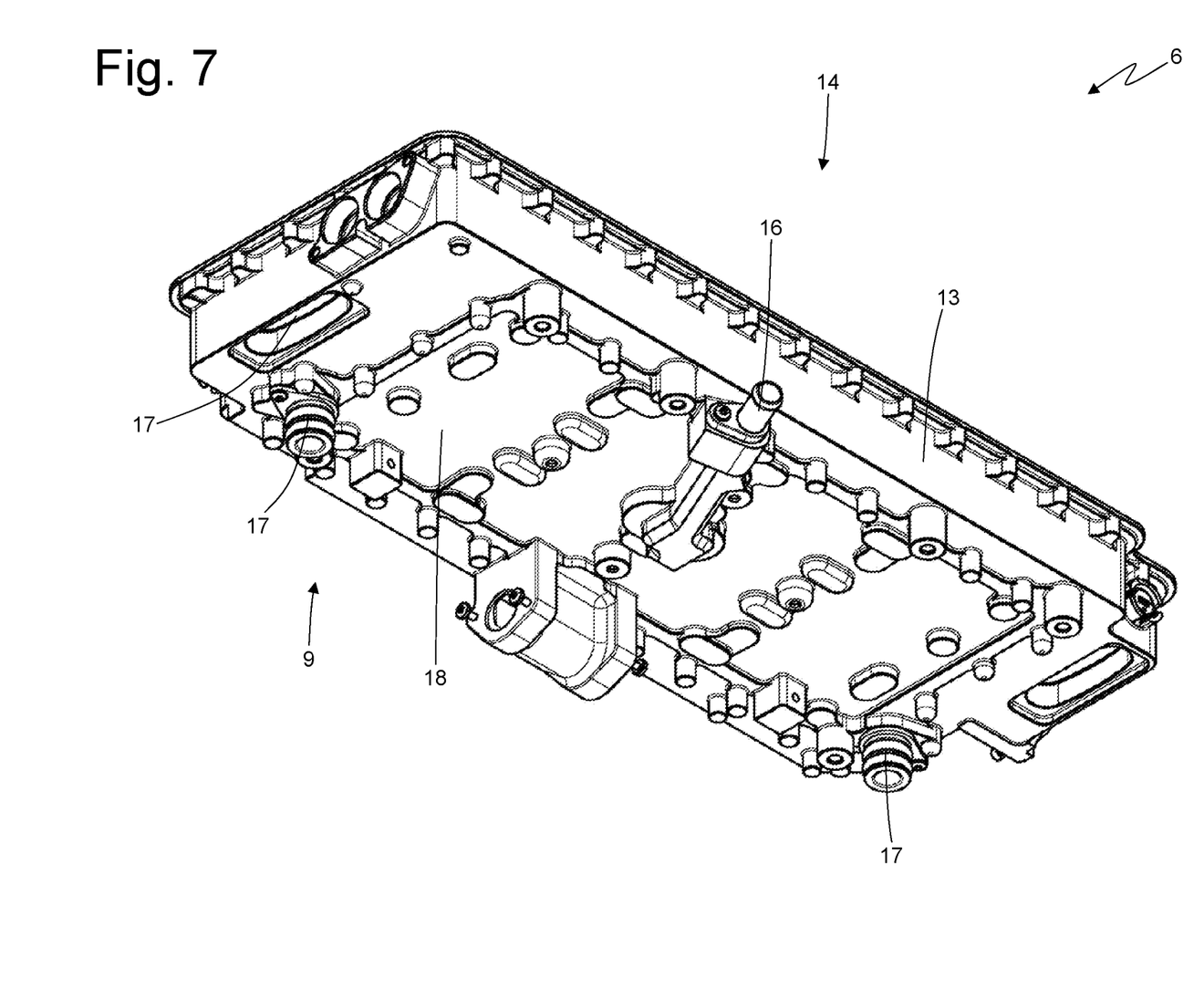
FIG. 7 is a perspective view from the bottom of the cup-shaped body of FIG. 5.

According to FIG. 7, the inlet 16 and the outlets 17 of the chamber 15 are obtained through the lower wall 18 of the cup-shaped body 13.

According to FIG. 3, the two groups 11 of power modules 10 and the two capacitors 12 are directly mounted on the containing wall 19, namely are in direct contact with the containing wall 19.

According to FIGS. 5 and 6, the containing wall 19 preferably comprises two through openings 20, which reproduce in negative the shape of the groups 11 of power modules 10 and are closed by the groups 11 of power modules 10 in a sealed manner (typically, through the interposition of a gasket visible in FIGS. 5 and 6); in this way, a lower wall of the power modules 10 is directly brushed (touched) by the cooling liquid located inside the chamber 15 and, hence, directly transfers heat to the cooling liquid located inside the chamber 15. Namely, the lower wall of the power modules 10 is part of the upper wall of the chamber 15 and, hence, is in direct contact with the cooling liquid located inside the chamber 15.

The containing wall 19 preferably comprises two through openings 21, which reproduce in negative the shape of the capacitors 12 and are closed by the capacitors 12 in a sealed manner (typically, through the interposition of a gasket visible in FIGS. 5 and 6); in this way, a lower wall of the capacitors 12 is directly brushed (touched) by the cooling liquid located inside the chamber 15 and, hence, directly transfers heat to the cooling liquid located inside the chamber 15. Namely, the lower wall of the capacitors 12 is part of the upper wall of the chamber 15 and, hence, is in direct contact with the cooling liquid located inside the chamber 15.

In the embodiment shown in the accompanying figures, each electronic power converter 6 has two groups 11 of power modules 10 and, hence, two capacitors 12; according to a different embodiment which is not shown herein, each electronic power converter 6 has only one group 11 of power modules 10 and, hence, one single capacitor 12.

The embodiments described herein can be combined with one another, without for this reason going beyond the scope of protection of the invention.

The vehicle 1 described above has numerous advantages.

First of all, the cooling system 14 of the electronic power converter 6 of the vehicle 1 described above is extremely effective, namely is capable of ensuring that the work temperature of the power modules 10 and of the capacitors 12 never is too high.

Furthermore, the cooling system 14 of the electronic power converter 6 of the vehicle 1 described above is very efficient, for it uses a reduced cooling liquid flow rate.

Finally, the electronic power converter 6 of the vehicle 1 described above is extremely compact and ensures low costs as well as a small manufacturing complexity.

LIST OF THE REFERENCE NUMBERS OF THE FIGURES 1 vehicle
2 wheels
3 powertrain system
4 electric motor
5 drivetrain
6 electronic power converter
7 power storage system
8 high-voltage electric system
9 container
10 power modules
11 group
12 condenser
13 cup-shaped body
14 cooling system
15 chamber
16 inlet
17 outlet
18 lower wall
19 containing wall
20 through openings
21 through openings

The invention claimed is:

1. A vehicle (1) comprising:
   two front wheels (2);
   two rear wheels (2);
   two electric motors (4), which are connected to the two wheels (2) of a same axle; and
   one single common electronic power converter (6) to control both electric motors (4) and comprising, in turn:
      two groups (11) of power modules (10), each designed to power with an alternating current one single phase of the electric motor (4);
      at least one capacitor (12), which is connected in parallel to a DC input;
      a container (9), which houses the two groups (11) of power modules (10) and the capacitor (12) and is provided with a cup-shaped body (13) provided with a lower wall (18); and
      a cooling system (14) provided with a chamber (15), which is configured to be flown through by a cooling liquid and is delimited, on one side, by the lower wall (18) of the cup-shaped body (13) of the container (9) and, on the other side, by a containing wall (19), which is arranged at a given distance from the lower wall (18);
   wherein the chamber (15) has one single cooling liquid inlet (16) arranged at the centre and two cooling liquid outlets (17) arranged on the sides; and
   wherein each cooling liquid outlet (17) is connected to a cooling system of a corresponding electric motor (4).

2. The vehicle (1) according to claim 1, wherein the two groups (11) of power modules (10) are arranged at two opposite ends of the container (9).

3. The vehicle (1) according to claim 1, wherein the a group (11) of power modules (10) is arranged on a right side of the container (9) and powers the phases of a right electric motor (4) and the other group (11) of power modules (10) is arranged on a left side of the container (9) and powers the phases of a left electric motor (4).

4. The vehicle (1) according to claim 1, wherein the capacitor (12) is arranged in the middle of the two groups (11) of power modules (10).

5. The vehicle (1) according to claim 4 and comprising two capacitors (12), which are arranged next to one another in the middle of the two groups (11) of power modules (10).

6. The vehicle (1) according to claim 1, wherein the containing wall (19) is smaller than the lower wall (18) and is fixed to the lower wall (18) in a sealed manner.

7. The vehicle (1) according to claim 1, wherein each group (11) of power modules (10) is directly mounted on the containing wall (19).

8. The vehicle (1) according to claim 7, wherein the containing wall (19) comprises two first through openings (20), each of which reproduces in negative the shape of a corresponding group (11) of power modules (10) and is closed by the group (11) of power modules (10) in a sealed manner so that a lower wall of the power modules (10) is directly brushed by the cooling liquid located inside the chamber (15).

9. The vehicle (1) according to claim 1, wherein the capacitor (12) is directly mounted on the containing wall (19).

10. The vehicle (1) according to claim 9, wherein the containing wall (19) comprises a second through opening (21), which reproduces in negative the shape of capacitor (12) and is closed by the capacitor (12) in a sealed manner so that a lower wall of the capacitor (12) is directly brushed by the cooling liquid located inside the chamber (15).

11. The vehicle (1) according to claim 1 and comprising two gate control devices, each of which is arranged above a corresponding group (11) of power modules (10).

12. The vehicle (1) according to claim 1 and comprising a control unit, which is housed in a lid, which is coupled to the container and is opposite the lower wall (18).

\* \* \* \* \*